(12) United States Patent
Kim et al.

(10) Patent No.: US 12,368,370 B2
(45) Date of Patent: Jul. 22, 2025

(54) DC/DC CONVERTER FOR PROVIDING MAXIMUM EFFICIENCY IN VARIOUS LOAD CURRENT RANGES

(71) Applicant: FADU Inc., Seoul (KR)

(72) Inventors: Seonho Kim, Suwon-si (KR); Jinup Lim, Seoul (KR); Jongchul Chae, Hwaseong-si (KR); Kichang Jang, Seoul (KR)

(73) Assignee: FADU Inc., Seoul (KR)

( * ) Notice: Subject to any disclaimer, the term of this patent is extended or adjusted under 35 U.S.C. 154(b) by 236 days.

(21) Appl. No.: 18/351,803

(22) Filed: Jul. 13, 2023

(65) Prior Publication Data

US 2024/0106317 A1 Mar. 28, 2024

Related U.S. Application Data

(60) Provisional application No. 63/409,882, filed on Sep. 26, 2022.

(30) Foreign Application Priority Data

Sep. 26, 2022 (KR) ........................ 10-2022-0121459

(51) Int. Cl.
*H02M 1/00* (2007.01)
*G01R 19/10* (2006.01)
*H02M 3/158* (2006.01)

(52) U.S. Cl.
CPC .......... *H02M 1/0077* (2021.05); *G01R 19/10* (2013.01); *H02M 3/158* (2013.01)

(58) Field of Classification Search
CPC ...... H02M 1/0077; H02M 3/158; G01R 19/10
See application file for complete search history.

(56) References Cited

U.S. PATENT DOCUMENTS

| | | | | |
|---|---|---|---|---|
| 6,396,250 B1* | 5/2002 | Bridge | ................. | H03K 17/165 323/283 |
| 2003/0214274 A1* | 11/2003 | Lethellier | ........... | H02M 3/1584 323/272 |
| 2007/0290664 A1* | 12/2007 | Moyer | .................... | H02M 1/32 323/272 |
| 2010/0109621 A1* | 5/2010 | Lee | ..................... | H02M 3/1584 323/268 |

(Continued)

FOREIGN PATENT DOCUMENTS

| | | |
|---|---|---|
| JP | 2011-109842 A | 6/2011 |
| JP | 2013-90399 A | 5/2013 |
| KR | 10-2019-0052353 A | 5/2019 |

OTHER PUBLICATIONS

Korean Notice of Allowance issued on Apr. 21, 2023 in corresponding Korean Patent application No. 10-2022-0121459 (3 pages in Korean).

*Primary Examiner* — Rafael O Leon De Domenech
(74) *Attorney, Agent, or Firm* — NSIP Law

(57) ABSTRACT

The present invention relates to a direct current/direct current (DC/DC) converter. According to the present invention, output ends of a plurality of converter circuits, each having two switches in a single fabricated integrated circuit (IC), are integrated by selectively connecting them to each other in the outside depending on the amount of current required for operation of the IC. Therefore, the DC/DC converter can operate with maximum efficiency in various user-desired load current ranges.

5 Claims, 13 Drawing Sheets

(56) References Cited

U.S. PATENT DOCUMENTS

2010/0109622 A1\* 5/2010 Miki .................. H02M 3/1584
  323/272
2010/0277961 A1\* 11/2010 Moyer .................. H02M 1/32
  363/163

\* cited by examiner (a)

(b)

DC/DC CONVERTER FOR PROVIDING MAXIMUM EFFICIENCY IN VARIOUS LOAD CURRENT RANGES

CROSS-REFERENCE TO RELATED APPLICATIONS

This application claims the benefit under 35 USC § 119(e) of U.S. Provisional Application No. 63/409,882 filed on Sep. 26, 2022, and the benefit under 35 USC § 119(a) of Korean Patent Application No. 10-2022-0121459 filed on Sep. 26, 2022, in the Korean Intellectual Property Office, the entire disclosures of which are incorporated herein by reference for all purposes.

BACKGROUND OF THE INVENTION

1. Field of the Invention

The present invention relates to a direct current/direct current (DC/DC) converter, and more specifically to a DC/DC converter that can operate with maximum efficiency in various user-desired load current ranges in a single integrated circuit (IC).

2. Description of the Related Art

A DC/DC converter is a circuit that steps down a relatively high DC voltage to a low DC voltage or, conversely, steps up a low DC voltage to a high DC voltage. Such DC/DC converters are critical components in the electronics industry and are used as power and battery charging circuits in computers, power tools, TVs, media tablets, smartphones, automobiles, and many other electrical and electronic devices. DC/DC converters are classified into boost converters which step up a DC input voltage and buck converters which step down a DC input voltage.

(a) and (b) of FIG. 1 illustrate structure and buck efficiency of a conventional buck converter, respectively. The buck converter includes two power metal oxide semiconductor field effect transistors (MOSFETs), an output inductor, and an output capacitor. This topology derives its name from a control method of two power MOSFETs. ON/OFF control is synchronized in order to provide a regulated output voltage and also to prevent the two MOSFETs from turning on at the same time. A high-side MOSFET HS is directly connected to an input voltage of the circuit. When the high-side MOSFET HS is turned on, current is supplied to a load through the high-side MOSFET HS. At the same time, a low-side MOSFET LS is turned off, an inductor current increases, and an LC filter is charged. When the high-side MOSFET HS is turned off, the low-side MOSFET LS is turned on and the charged current is fed to the load. At the same time, the inductor current decreases, and thus the LC filter is discharged. Eventually, when the two MOSFETs are repeatedly turned on and off alternately, an output voltage may be generated based on their on/off ratio. (b) of FIG. 1 illustrates an efficiency curve of a well-designed buck converter, showing the inflection of efficiency with load. The reason for this efficiency inflection (a decrease in efficiency) is complex and reflects a number of factors that a designer may take into account during a design phase to achieve the best efficiency at a given load. Referring to (b) of FIG. 1, although a maximum efficiency is 92% at a load of 2 A, the efficiency gradually decreases at or above the load of 2 A and reaches 89% at 4 A and 87% at 5 A. Furthermore, the converter is prohibited from being used at or above 6 A due to its insufficient capacity. Therefore, when a user applies a DC/DC converter with this efficiency curve to a system running at 4 A, 3% of a maximum efficiency is wasted.

While this efficiency curve is taken into account in the design, it is not easy to change once the design is complete. For this reason, the user often has no choice but to operate the system in a relatively low efficiency range, instead of a maximum efficiency range. To achieve the maximum efficiency, the user has to replace the DC/DC converter every time or change unnecessary internal/external settings.

Thus, there is an urgent need for a solution to the deep-rooted problem of low efficiency of conventional DC/DC converters.

SUMMARY OF THE INVENTION

The present invention has been made in an effort to solve the problems of the prior art and an aspect of the present invention is to provide a direct current/direct current (DC/DC) converter that can operate with maximum efficiency in various user-desired load current ranges by selectively connecting output ends of a plurality of converter circuits, each having two switches within a single integrated circuit (IC), in the outside and thus integrating them.

A DC/DC converter according to one embodiment of the present invention includes N (N is a natural number equal to or greater than 2) converter circuits, each including a high-side switch connected to an input voltage, a low-side switch connected to the high-side switch at one node, and an output end connected to the node to output an output voltage, and M (M is a natural number equal to or greater than 2) converter controllers configured to control the N converter circuits wherein the N converter circuits form K (K is a natural number equal to or greater than 1) converter circuit groups, each having one integrated output end obtained by electrically connecting the output ends of at least two of the N converter circuits to each other, and wherein the K converter circuit groups are integrally controlled by the converter controllers on a one-to-one basis.

According to an exemplary embodiment of the present invention, the DC/DC converter may further include a grouping unit configured to connect the at least two output ends to each other to form the converter circuit group.

According to an exemplary embodiment of the present invention, the DC/DC converter may further include a grouping controller configured to monitor whether the converter circuit groups have been formed and to match individual converter circuits not constituting converter circuit groups and the converter circuit groups to the corresponding M converter controllers.

According to an exemplary embodiment of the present invention, the grouping controller may include a grouping detector configured to detect whether the converter circuit groups have been formed and to generate a grouping signal including information about the individual converter circuits and the converter circuit groups, N multiplexers corresponding one-to-one to the N converter circuits, each being configured to select any one of switching control signals input from the M converter controllers, for the high-side switch and the low-side switch of a converter circuit corresponding to the multiplexer, and output the selected switching control signal to the converter circuit, and a multiplexer controller configured to transmit an output selection signal to each of the N multiplexers to select the output switching control signal, based on the grouping signal.

According to an exemplary embodiment of the present invention, the grouping detector may include a current source configured to apply a test current to each of the output ends of the converter circuits, a switch arranged between the current source and each of the output ends, a test voltage measurer configured to measure a test voltage at each of the output ends, whenever each of the switches is turned on and a switching operation of turning on any one of the low-side switches and turning off the other low-side switches is repeated sequentially, and a grouping signal generator configured to perform the switching operation, compare the test voltages, and generate the grouping signal.

According to an exemplary embodiment of the present invention, the grouping detector may include a first current source unit including, for each of the converter circuits, a first current source and a first switch connected in series between the input voltage and the output end, a second current source unit including, for each of the converter circuits, a second current source and a second switch connected in series between the output end and a ground voltage, a test voltage measurer configured to, for each of the converter circuits, measure a test voltage at the output end whenever a switching operation of turning on the first switch of any one of the converter circuits and the second switches of the other converter circuits is repeated sequentially, and a grouping signal generator configured to perform the switching operation, compare the test voltages, and generate the grouping signal.

According to an exemplary embodiment of the present invention, the grouping detector may include a first resistor unit including, for each of the converter circuits, a first resistor and a first switch connected in series between the input voltage and the output end, a second resistor unit including, for each of the converter circuits, a second resistor and a second switch connected in series between the output end and a ground voltage, a test voltage measurer configured to, for each of the converter circuits, measure a test voltage at the output end whenever a switching operation of turning on the first switch of any one of the converter circuits and the second switches of the other converter circuits is repeated sequentially, and a grouping signal generator configured to perform the switching operation, compare the test voltages, and generate the grouping signal.

The features and advantages of the present invention will become apparent from the following description with reference to the accompanying drawings.

Prior to the detailed description of the invention, it should be understood that the terms and words used in the specification and the claims are not to be construed as having common and dictionary meanings but are construed as having meanings and concepts corresponding to the technical spirit of the present invention in view of the principle that the inventor can define properly the concept of the terms and words in order to describe his/her invention with the best method.

According to the present invention, some or all of the output ends of the plurality of converter circuits, each having two switches in a single fabricated integrated circuit (IC), are integrated by selectively connecting them to each other in the outside depending on the amount of current required for operation of the IC. Therefore, the integrated output end and the individual output end can be operated with maximum efficiency in different load current ranges.

A maximum load current driving capability can also be increased.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE INVENTION

Figure 1:
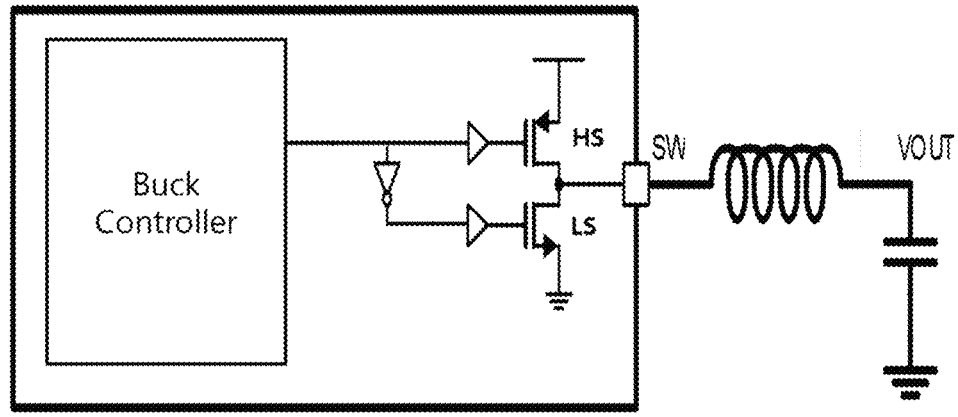
FIG. 1 illustrate (a) structure and (b) buck efficiency of a conventional buck converter.
Figure 1:
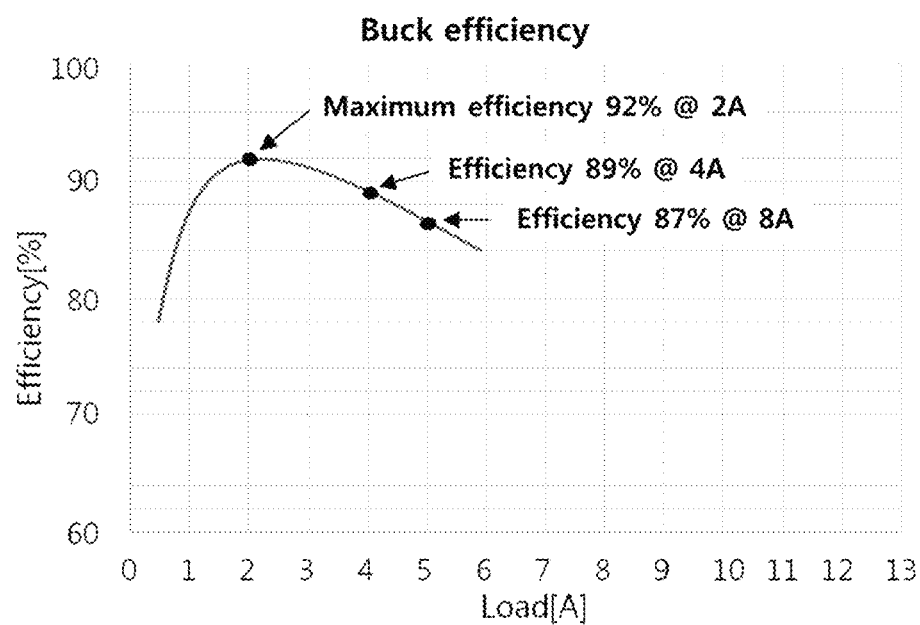

The objects, specific advantages, and novel features of the present invention will become apparent from the following detailed description and preferred embodiments in conjunction with the accompanying drawings. It should be noted that in the drawings, the same components are denoted by the same reference numerals even though they are depicted in different drawings. Although such terms as "first" and "second," etc. may be used to describe various components, these components should not be limited by above terms. These terms are used only to distinguish one component from another. In the description of the present invention, detailed explanations of related art are omitted when it is deemed that they may unnecessarily obscure the essence of the present invention.

Preferred embodiments of the present invention will now be described in detail with reference to the accompanying drawings.

Figure 2:
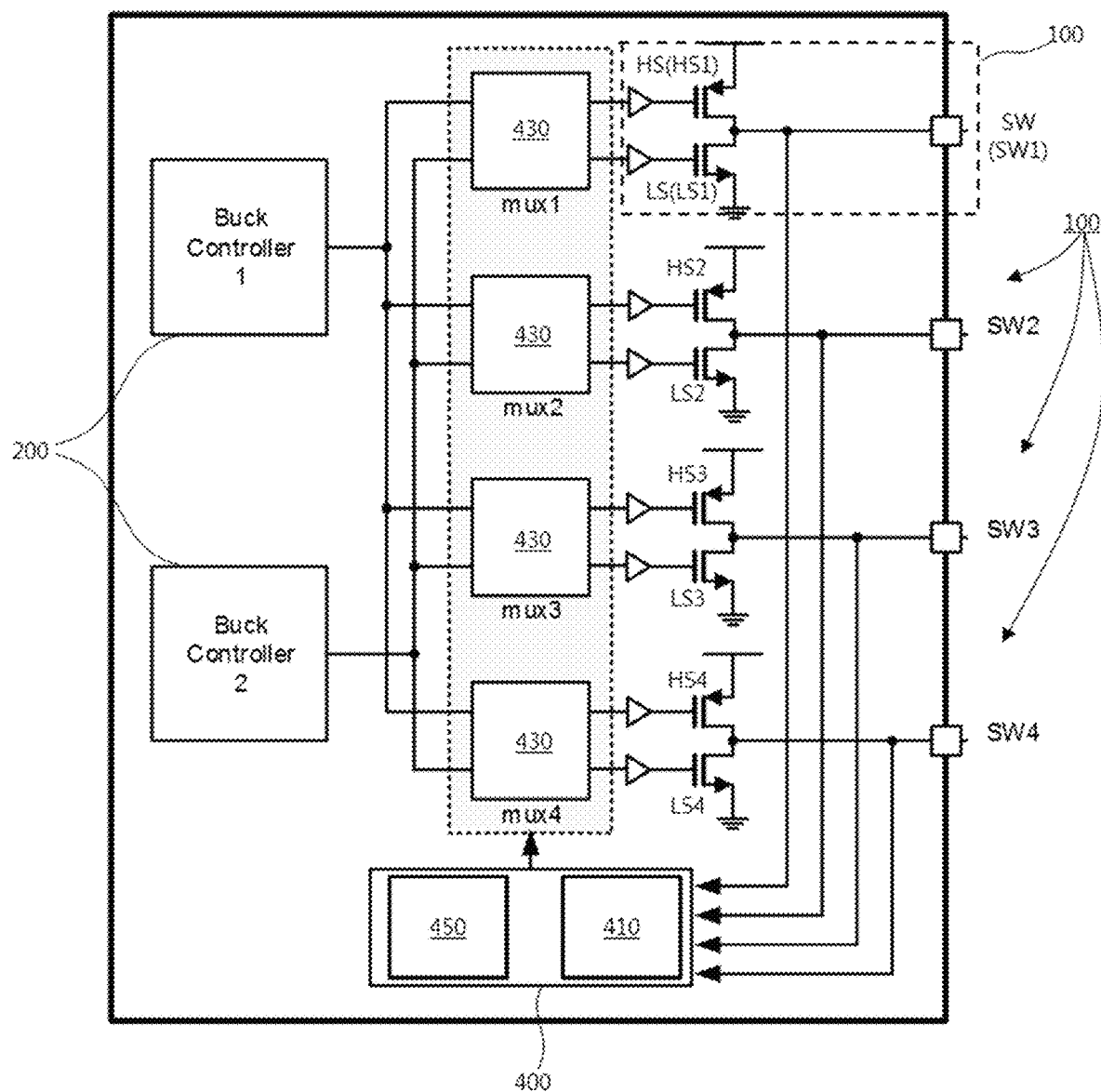
FIG. 2 schematically illustrates the configuration of a direct current/direct current (DC/DC) converter according to the present invention.
Figure 3:
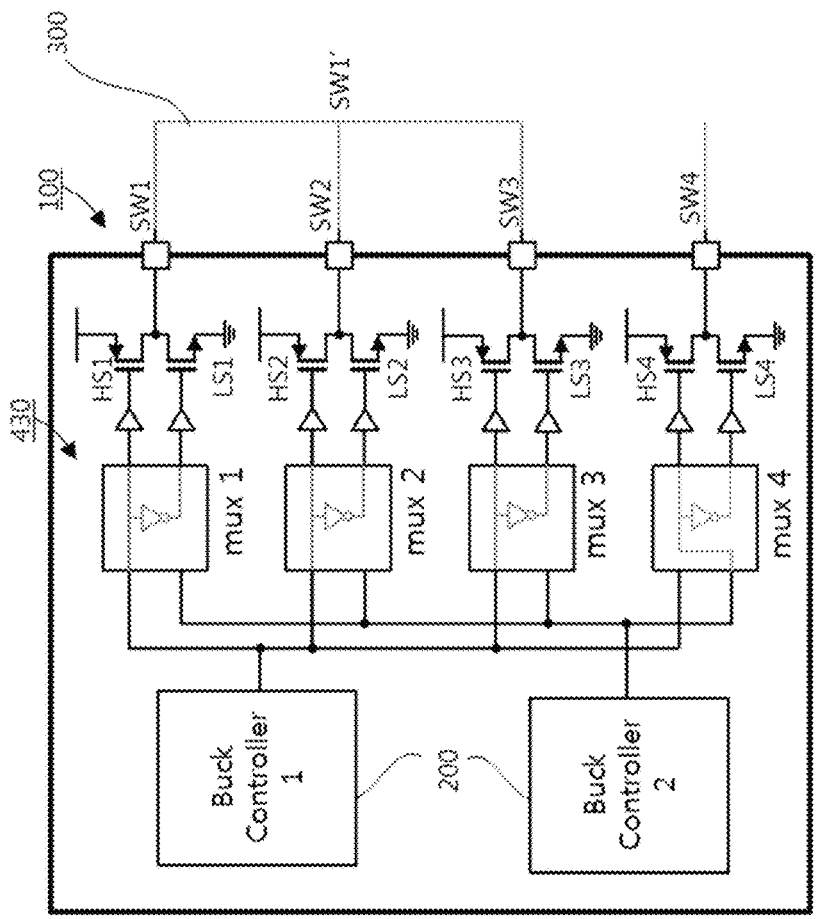
FIG. 3 illustrates a process of grouping converter circuits in a DC/DC converter of the present invention.
Figure 3:
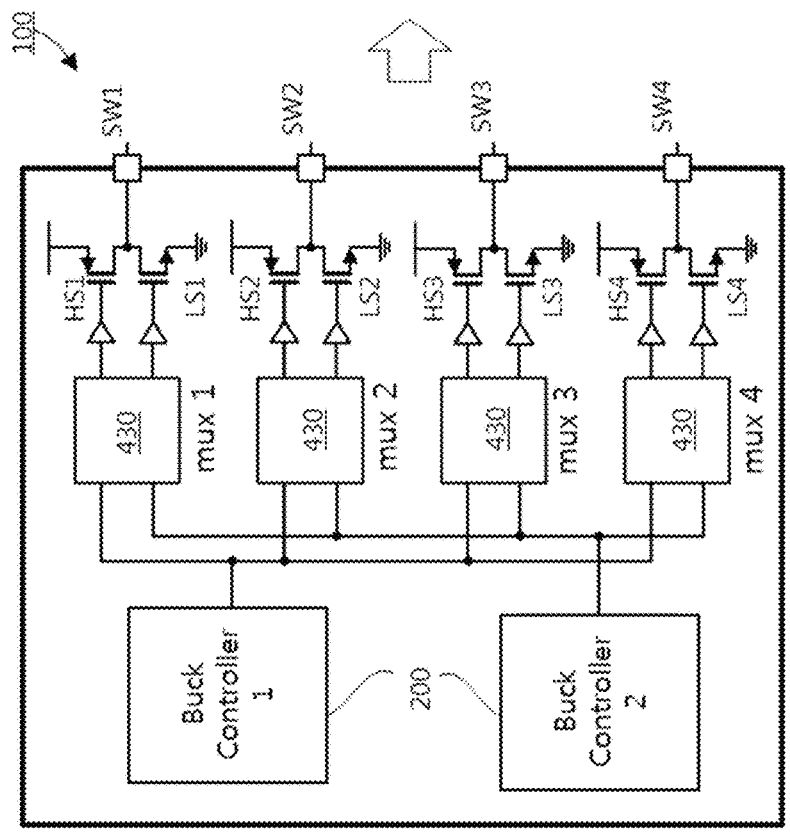
Figure 4A:
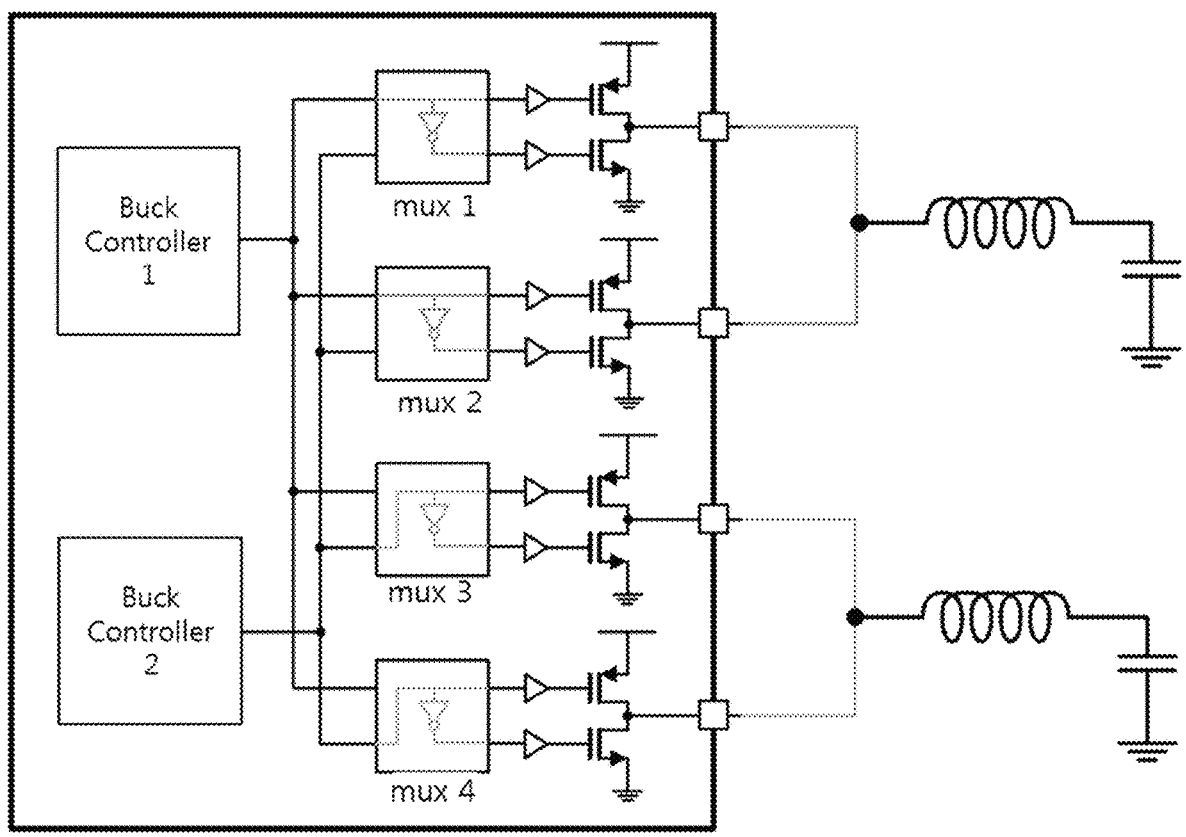
FIGS. 4A to 4D illustrate exemplary embodiments in which converter circuits are grouped.
Figure 4B:
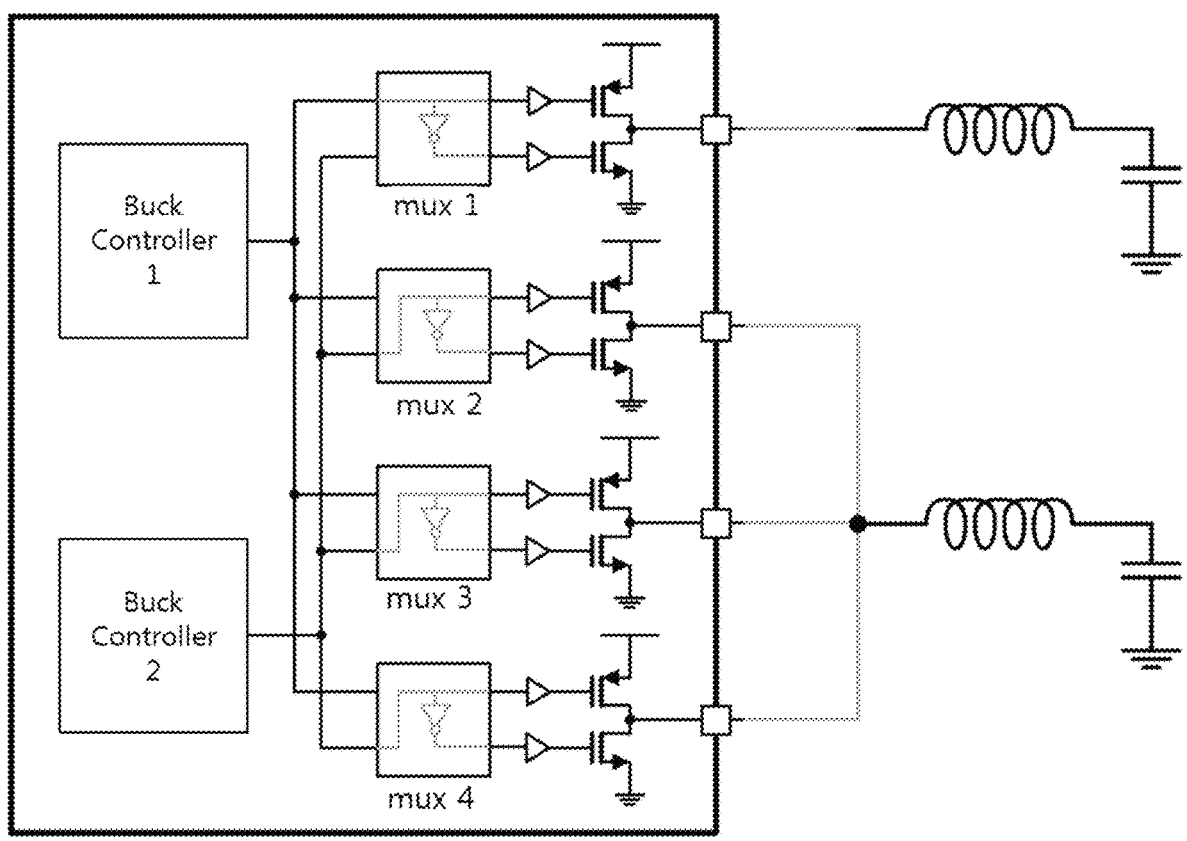
Figure 4C:
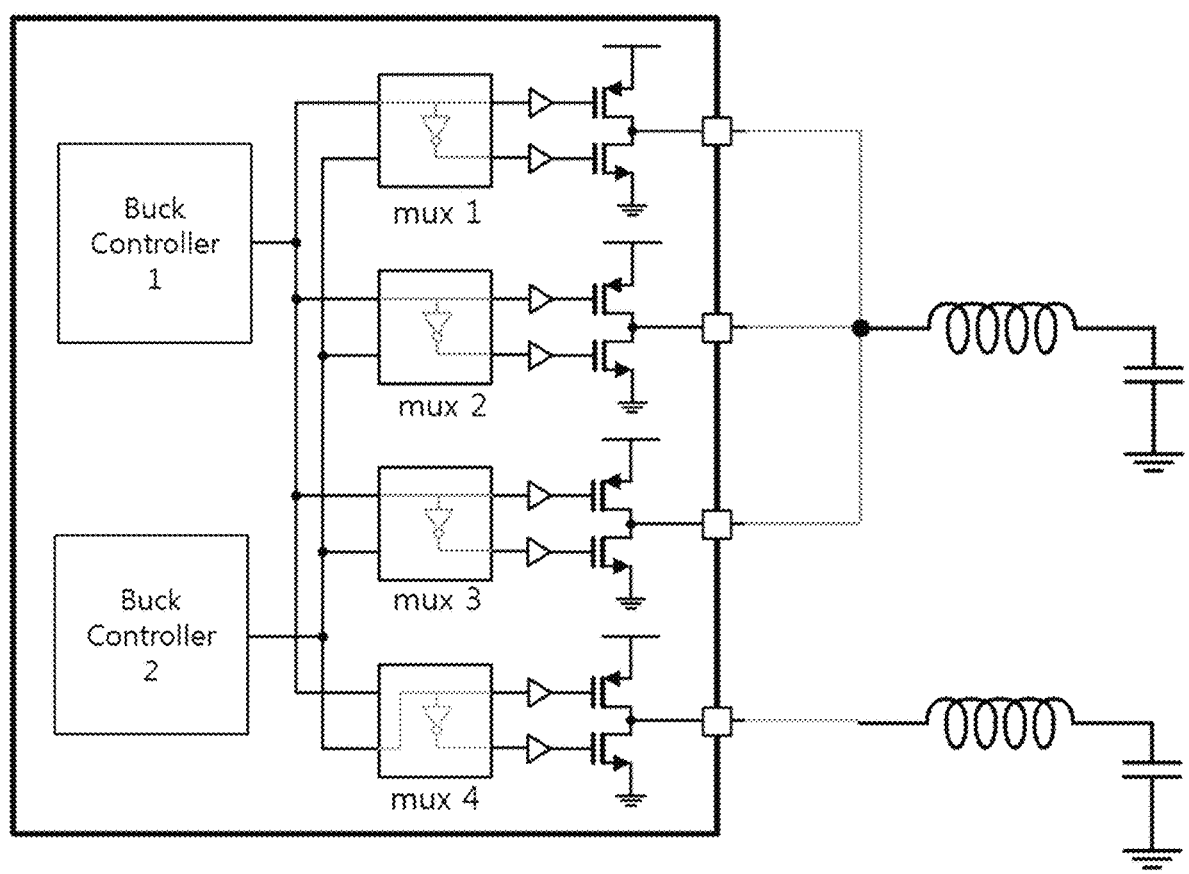
Figure 4D:
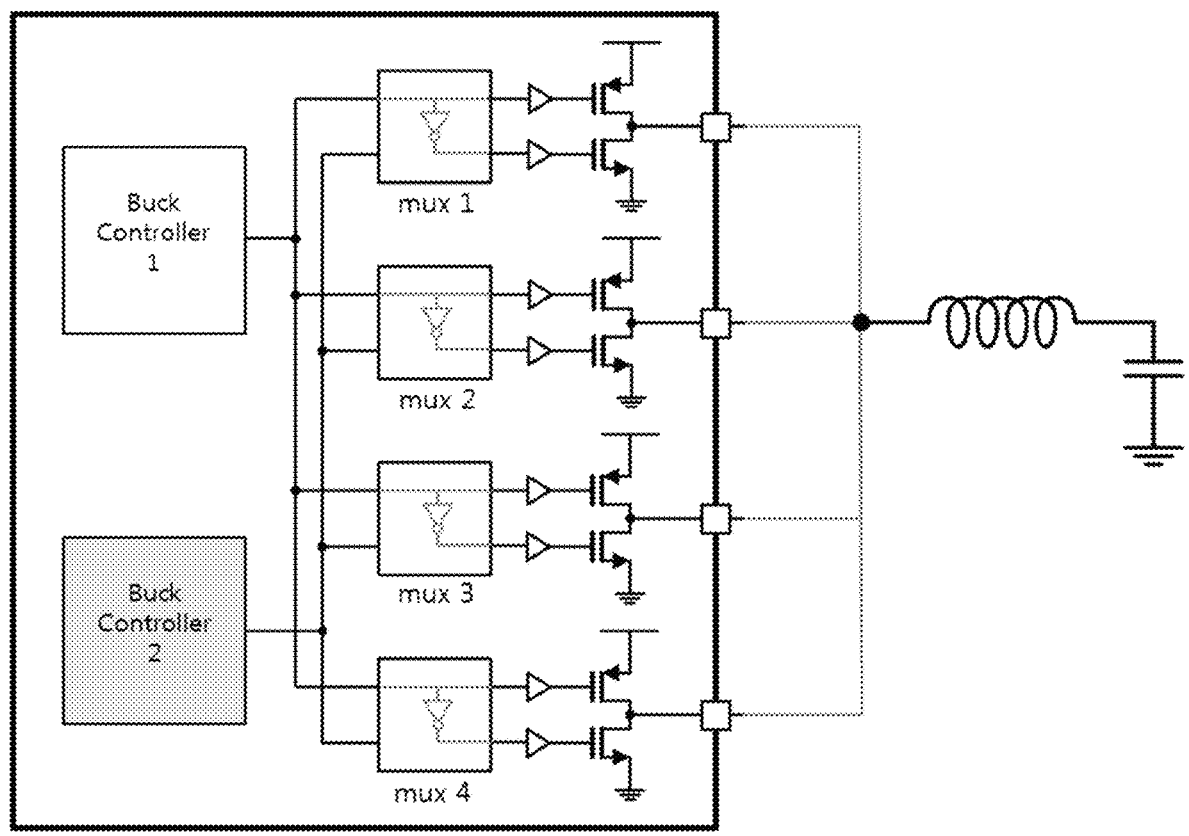
Figure 5:
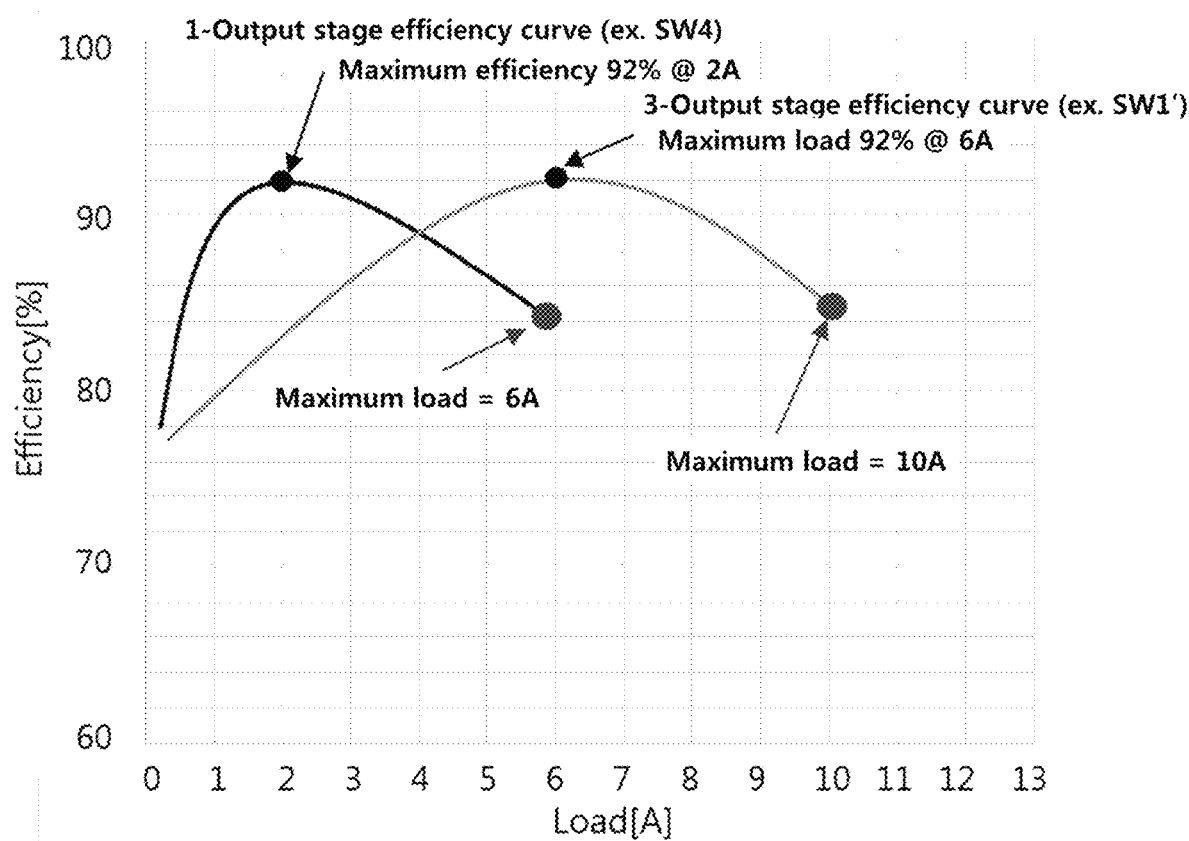
FIG. 5 illustrates efficiencies when the converter circuits are grouped according to FIG. 3.

FIG. 2 schematically illustrates the configuration of a direct current/direct current (DC/DC) converter according to the present invention, FIG. 3 illustrates a process of grouping converter circuits in the DC/DC converter of the present invention, FIGS. 4A to 4D illustrate exemplary embodiments in which the converter circuits are grouped, and FIG. 5 illustrates efficiencies when the converter circuits are grouped according to FIG. 3.

As illustrated in FIGS. 2 and 3, the DC/DC converter of the present invention includes N (N is a natural number equal to or greater than 2) converter circuits 100, each including a high-side switch HS connected to an input voltage, a low-side switch LS connected to the HS at one node, and an output end SW connected to the node to output an output voltage, and M (M is a natural number equal to or greater than 2) converter controllers 200 controlling the N converter circuits 100 wherein the N converter circuits 100 form K (K is a natural number equal to or greater than 1) converter circuit groups, each having one integrated output end S1' obtained by electrically connecting the output ends SW of at least two of the N converter circuits 100 to each other, and wherein the K converter circuit groups are integrally controlled by the converter controllers 200 on a one-to-one basis.

The present invention relates to a DC/DC converter. Since a conventional DC/DC converter has maximum efficiency at only one load current point, it wastes efficiency in various load current ranges and requires converter replacement or unnecessary internal/external setting changes to realize maximum efficiency in various current ranges. As a solution to these problems, the present invention provides a DC/DC converter that can operate with maximum efficiency in various user-desired load current ranges in a single integrated circuit (IC).

Specifically, the DC/DC converter of the present invention includes a plurality of converter circuits 100 and converter controllers 200.

Each of the converter circuits 100 essentially includes a high-side switch HS, a low-side switch LS, and an output end SW. The high-side switch HS and the low-side switch LS may be implemented by power metal oxide semiconductor field effect transistors (MOSFETs). The high-side switch HS has one end connected to an input voltage and the other end connected to the low-side switch LS through one node, which is also connected to the output end SW. When the input voltage is applied, the high-side switch HS and the low-side switch LS repeat on/off alternately and output an output voltage through the output end SW. An output inductor and an output capacitor may be connected to the output end SW and the converter circuit 100 may operate as a boost converter that steps up a DC input voltage and outputs the stepped-up DC voltage or as a buck converter that steps down a DC input voltage and outputs the stepped-down DC voltage. Accordingly, although the topology of a buck converter is illustrated in the accompanying drawings, this is provided for illustrative purposes only and should not be construed as limiting the scope of the claims as set forth below.

The DC/DC converter of the present invention is a single IC in which N (N is a natural number equal to or greater than 2) converter circuits 100 are arranged. Accordingly, the DC/DC converter of the present invention has the same number of output ends SW as the converter circuits 100. All or some of the N individual converter circuits 100 may be grouped. Each of the converter circuit groups is formed by electrically connecting the output ends SW of at least two of the individual converter circuits 100 to each other. That is, the converter circuits 100 having their output ends SW connected to each other constitute a converter circuit group. The number (K) of the converter circuit groups may be a natural number equal to or greater than 1. For example, under the assumption that the number of the converter circuits 100 is 10, the first to third converter circuits 100 with their output ends SW connected to each other may form a first converter circuit group, the fourth to eighth converter circuits 100 with their output ends SW connected to each other may form a second converter circuit group, and the ninth and tenth converter circuits 100 may be used individually without their output ends SW being connected to each other. Each of the converter circuit groups has one integrated output end SW' with the output ends SW of the converter circuits belonging to the converter circuit group connected to each other.

The converter controllers 200 control the operation of the converter circuits 100. Under the control of the converter controllers 200, the high-side switches HS and the low-side switches LS of the converter circuits 100 may be alternately turned on and off to output an output voltage.

The number (M) of the converter controllers 200 arranged in the DC/DC converter of the present invention as a single IC is a natural number equal to or greater than 2. The converter circuit groups are integrally controlled by the converter controllers 200 on a one-to-one basis. That is, in the above example, the first converter circuit group may be controlled by the first converter controller 200, the second converter circuit group may be controlled by the second converter controller 200, and the ninth and tenth converter circuits 100 may be controlled by the third and fourth converter controllers 200, respectively. Since all or some of the N converter circuits 100 are grouped, the number (M) of the converter controllers 200 is less than the number (N) of the converter circuits 100. For reference, four converter circuits 100 and two converter controllers 200 are illustrated in the attached drawings. However, the numbers of the converter circuits and the converter controllers are merely illustrative and are not intended to limit the scope of the present invention.

Each of the converter circuit groups are formed by electrically connecting the output ends SW of the corresponding converter circuits 100 to each other. The connection between the output ends SW may be performed by a grouping unit 300 outside the IC. For example, the output ends SW of the converter circuits 100 may be electrically connected to each other through electrically conductive members (e.g., wires), which are connected to output terminals one-to-one corresponding to the output ends SW of the converter circuits 100. The electrically conductive members may be included in the grouping unit 300. The grouping unit 300 may further include an output inductor connected to the electrically conductive members and an output capacitor (see FIGS. 4A to 4D) and constitutes an integrated output end ("SW1"' in FIG. 3).

Here, a choice can be made as to which ones of the output ends SW of the converter circuits 100 are to be connected to each other. That is, a user can freely connect the output ends SW of two or more of the converter circuits 100 to each other through the external grouping unit 300 to form a converter circuit group, taking into account the specification of a system to be operated. After the grouping unit 300 has formed the converter circuit group, it does not need to be integrated into the converter circuit group for its continuous use. Rather, the grouping unit 300 may be separated from the output ends SW and used to form another converter circuit group. That is, depending on a system use environment, the user can determine the corresponding converter circuits 100 forming the converter circuit group and can freely change the number of the converter circuits 100.

FIGS. 4A to 4D illustrate various exemplary embodiments in which the converter circuits 100 are grouped. These figures are based on the assumption that the first to fourth converter circuits 100 are arranged from the top right to the bottom right and the first and second converter controllers 200 are arranged from the top left to the bottom left in the DC/DC converter. FIG. 4A illustrates a first embodiment in which the first and second converter circuits 100 form a first converter circuit group and are integrally controlled by the first converter controller 200 and the third and fourth converter circuits 100 form a second converter circuit group and are integrally controlled by the second converter controller 200. FIG. 4B illustrates a second embodiment in which the first converter circuit 100 does not constitute a converter circuit group and is individually controlled by the first converter controller 200 and the second to fourth converter circuits 100 form a first converter circuit group and are integrally controlled by the second converter controller 200. FIG. 4C illustrates a third embodiment in which the first to third converter circuits 100 form a first converter circuit group and are integrally controlled by the first converter controller 200 and the fourth converter circuit 100 is individually controlled by the second converter controller 200. FIG. 4D illustrates a fourth embodiment in which the first to fourth converter circuits 100 form a first converter circuit group and are integrally controlled by the first converter controller 200 and the second converter controller 200 does not operate.

As described above, the converter circuits may be provided in groups and/or individually in the DC/DC converter. Due to this construction, the DC/DC converter can be operated with maximum efficiency in different load current ranges and have an increased maximum load current driving capability. FIG. 5 illustrates the efficiencies of the DC/DC converter in which the first to third converter circuits 100 form a converter circuit group and the fourth converter circuit 100 exists separately, as in FIGS. 3 to 4C. Referring to FIG. 5, the first to third converter circuits 100 are operated in parallel, like a single converter. The maximum load driving capability of the integrated output end SW1' (3 output stage) of the converter circuit group is increased compared to that of the output end SW4 (1 output stage) of the single converter circuit 100. As a result, the efficiency curve is shifted to the right. The single output end SW4 operates with highest efficiency at 2 A, whereas the integrated output end SW1' operates with highest efficiency at 6 A. In addition, the maximum load current driving capability (10 A) is higher when the integrated output end SW1' is used than that (6 A) when the single output end SW4 is used. Thus, the designer can provide a specification of maximum load driving capabilities and highest efficiency ranges according to the combinations and the user can refer to the specification to use the DC/DC converter in the highest efficiency range adapted to a system through a simple external connection.

The DC/DC converter of the present invention may further include a grouping controller 400.

The grouping controller 400 monitors whether the converter circuit groups have been formed and matches the converter circuit groups and/or the individual converter circuit 100 not constituting a converter circuit group to the corresponding converter controllers 200.

The grouping controller 400 may include a grouping detector 410, multiplexers 430, and a multiplexer controller 450.

The grouping detector 410 detects whether the converter circuit groups have been formed and generates a grouping signal. The grouping signal includes information about the individual converter circuits 100 and the converter circuit groups. With reference to FIGS. 6 to 10, a description will be given of how to implement the grouping detector 410.

Each of the multiplexers 430 is a combination circuit that selects one of a plurality of input lines and connects the selected input line to a single output line and is referred to simply as MUX. The number of the multiplexers 430 is N. The N multiplexers 430 correspond one-to-one to the N converter circuits 100. Each of the N multiplexers transmits a switching control signal to the corresponding converter circuit 100. The switching control signals are signals that control the high-side switch HS and the low-side switch LS. The switching control signals are generated by the converter controllers 200 and are transmitted through the multiplexers 430. Each of the N multiplexers 430 is connected to all of the M converter controllers 200. Accordingly, M switching control signals from the M converter controllers 200 may be input to one multiplexer 430. One of the multiplexers 430 selects only one of the M input switching control signals and transmits the selected input switching control signal to the corresponding converter circuit 100.

The multiplexer controller 450 transmits an output selection signal to each of the multiplexers 430 based on the grouping signal. The output selection signal is a signal that determines which one of the M input switching control signals the multiplexer 430 selects. Thus, the N converter circuits 100 and the M converter controllers 200 are matched to each other. As an example, referring to FIG. 3, the first to fourth multiplexers (mux1 to mux4) 430 correspond one-to-one to the first to fourth converter circuits 100 having the output ends SW1 to SW4, respectively, and both the first and second converter controllers 200 are connected to each of the first to fourth multiplexers (mux1 to mux4) 430. When assuming that the first to third converter circuits 100 form a converter circuit group, the grouping detector 410 generates a grouping signal indicating that the first to third converter circuits 100 form a converter circuit group and the fourth converter circuit 100 exists individually, and transmits the grouping signal to the multiplexer controller 450. Based on the grouping signal, the multiplexer controller 450 transmits output selection signals to the first to third multiplexers 430 so that the first to third multiplexers 430 receive switching control signals from the first converter controller 200 and transmit the switching control signals to the first to third converter circuits 100. The multiplexer controller 450 transmits an output selection signal to the fourth multiplexer 430 so that the fourth multiplexer 430 receives a switching control signal from the second converter controller 200 and transmits the switching control signal to the fourth converter circuit 100. Accordingly, the converter circuit group and the fourth converter circuit 100 are matched to and controlled by the first converter controller 200 and the second converter controller 200, respectively.

The grouping detector 410 will be described with reference to various embodiments.

Figure 6:
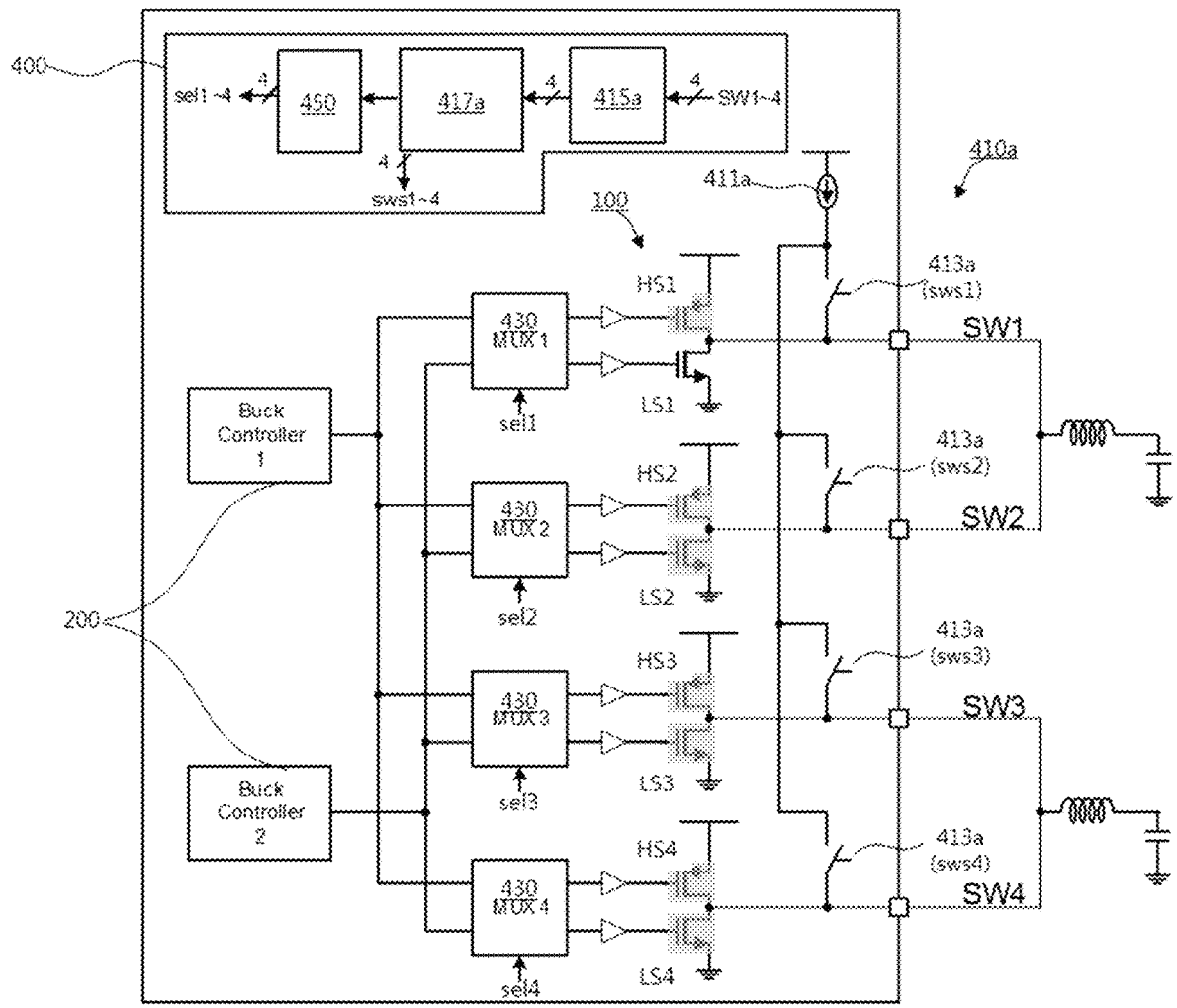
FIG. 6 schematically illustrates the configuration of a grouping detector according to a first embodiment of a DC/DC converter according to the present invention.
Figure 7:
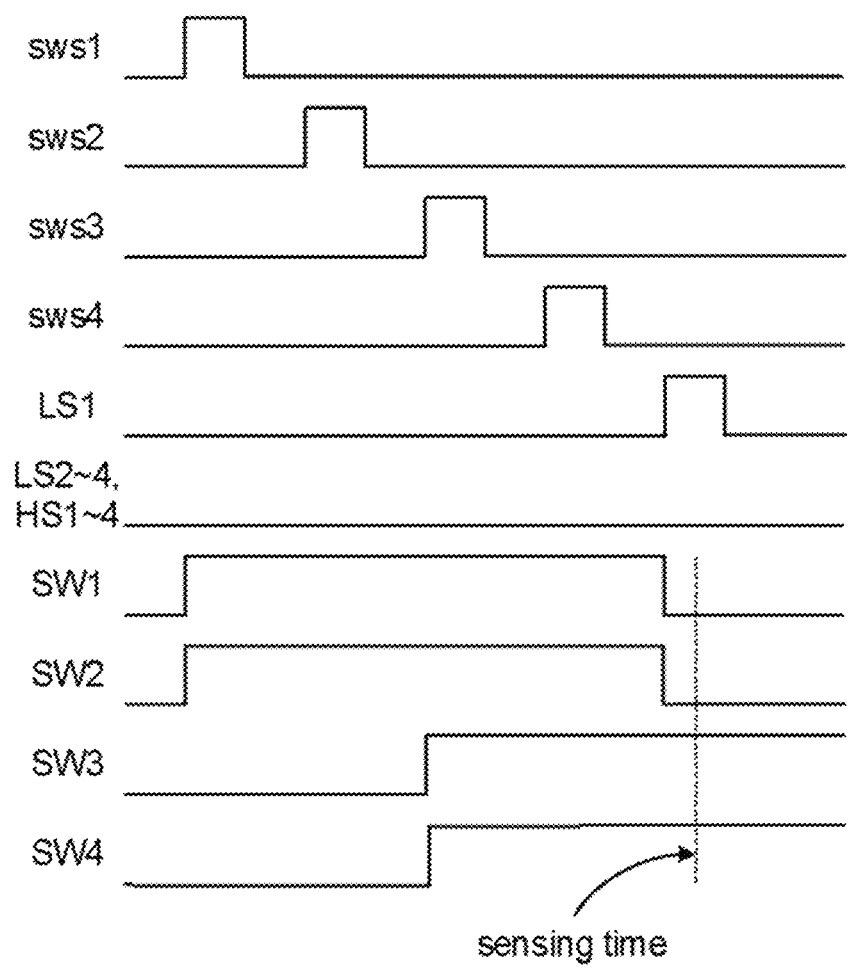
FIG. 7 illustrates the operation of the grouping detector illustrated in FIG. 6.

FIG. 6 schematically illustrates the configuration of a grouping detector according to a first embodiment of the DC/DC converter according to the present invention, and FIG. 7 illustrates the operation of the grouping detector illustrated in FIG. 6.

As illustrated in FIG. 6, the grouping detector 410a may include a current source 411a, switches 413a, a test voltage measurer 415a, and a grouping signal generator 417a.

The current source 411a applies a test current to each of the output ends SW1 to SW4 of the converter circuits 100.

The switches 413a are arranged between the current source 411a and the corresponding output ends SW1 to SW4. Accordingly, the number of the switches 413a is as many as the number of the converter circuits 100.

The test voltage measurer 415a measures a test voltage output from the output end SW of each of the converter circuits 100. Each time each of the switches 413a is turned on and a switching operation of turning on any one of the low-side switches LS and turning off the other low-side switches LS is repeated sequentially, the test voltage measurer 415a measures a test voltage at each output end SW.

The grouping signal generator 417a performs the switching operation, compares the test voltages at the output ends SW, and generates a grouping signal.

The operation of the grouping detector 410a according to the first embodiment will be described in more detail with reference to FIGS. 6 and 7. The DC/DC converter illustrated in FIG. 6 is based on the assumption that the four (first to fourth) converter circuits 100, the four (first to fourth) multiplexers (MUX1 to MUX4) 430, and the two (first and second) converter controllers 200 are arranged from top to bottom, the output ends SW1 and SW2 of the first and second converter circuits 100 are externally connected to each other, and the output ends SW3 and SW4 of the third and fourth converter circuits 100 are externally connected to each other, respectively.

The current source 411a applies a small amount of current to each of the output ends SW1 to SW4 for a short time. For this purpose, the grouping signal generator 417a turns on each switch 413a. As a result, an input voltage VDD is applied to the output ends SW1 to SW4. Subsequently, the low-side switch LS1 of the first converter circuit 100 is turned on and the remaining high-side switches HS1 to HS4 and low-side switches LS2 to LS4 are turned off. This changes the voltage of the output end SW1 to a ground voltage GND. At this time, the voltage of the output end SW2 externally connected to the output end SW1 also becomes the ground voltage and the output ends SW3 and SW4, which are not externally connected to the output end SW1, maintain the voltage VDD. The test voltage measurer 415a measures the voltages of the output ends SW1 to SW4 and the grouping signal generator 417a determines the output end SW2 externally connected to the output end SW1 to generate a grouping signal.

The above turn-on process can be repeated in the order of LS1→LS2→LS3→LS4 to accurately determine the connection statuses of the output ends SW1 to SW4. Once the grouping signal is generated, the multiplexer controller 450 generates output selection signals based on the grouping signal to control the multiplexers 430. When the converter circuit group and the individual converter circuit 100 are matched to the converter controllers 200, the DC/DC converter is operated normally by the converter controllers 200. After completion of the matching process, the converter controllers 200 may set a variable delay between switching clock signals to flexibly respond to possible noise or electromagnetic interference (EMI) issues during operation.

Figure 8:
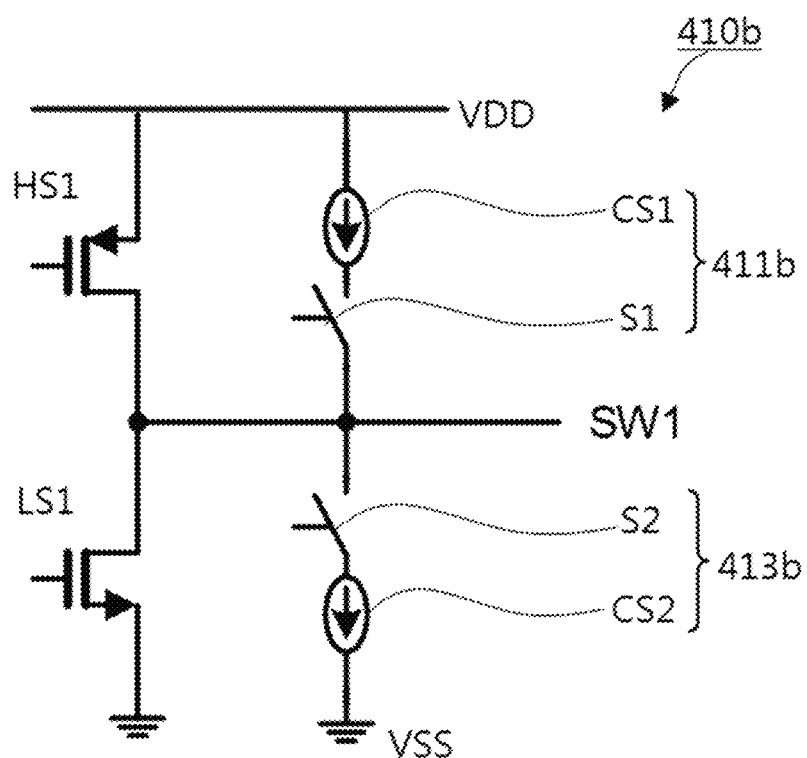
FIG. 8 schematically illustrates the configuration of a grouping detector according to a second embodiment of a DC/DC converter according to the present invention.
Figure 9:
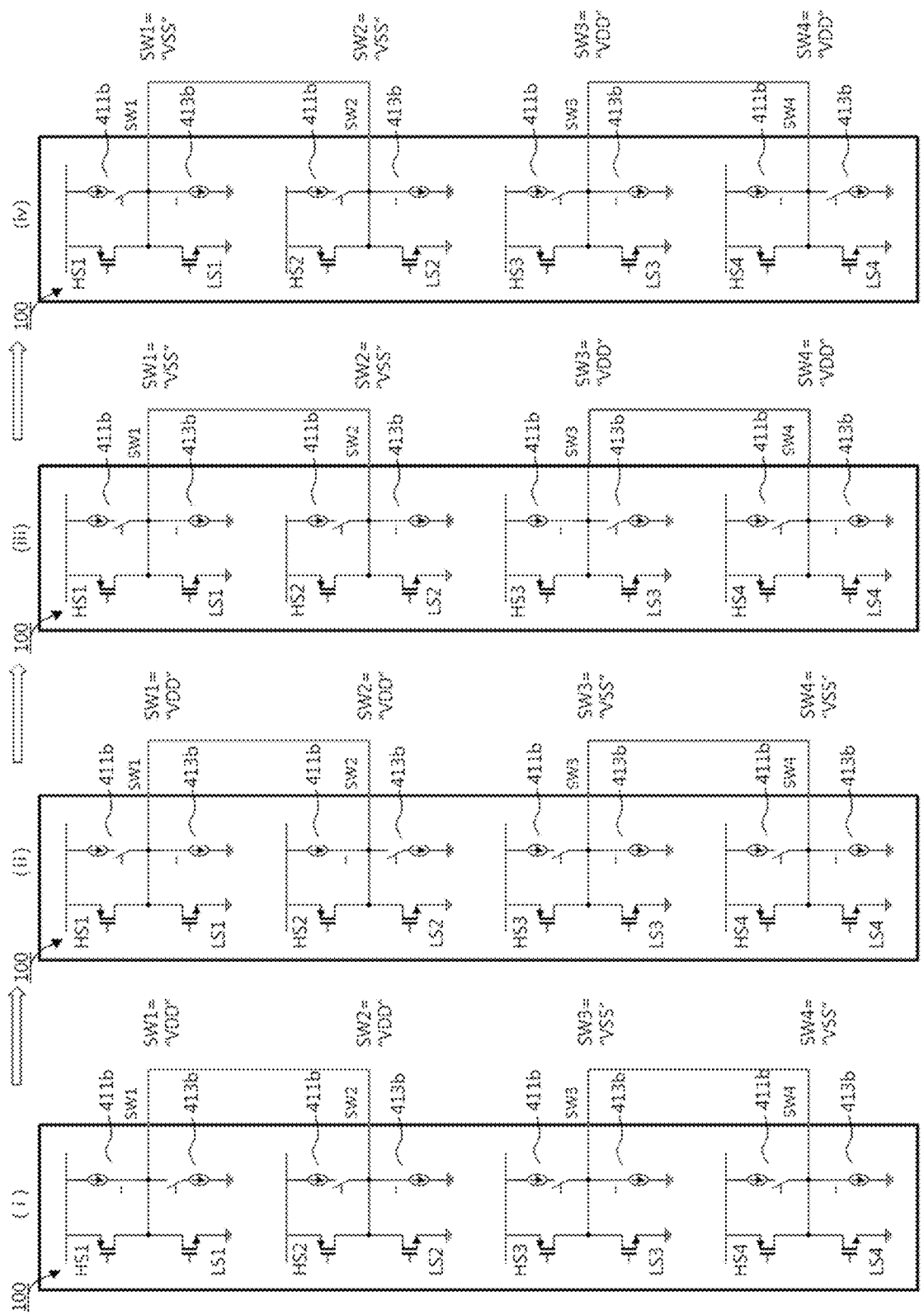
FIG. 9 illustrates the operation of the grouping detector illustrated in FIG. 8.

FIG. 8 schematically illustrates the configuration of a grouping detector according to a second embodiment of the DC/DC converter according to the present invention and FIG. 9 illustrates the operation of the grouping detector illustrated in FIG. 8.

As illustrated in FIGS. 8 and 9, the grouping detector 410b may include a first current source unit 411b, a second current source unit 413b, a test voltage measurer (not illustrated), and a grouping signal generator (not illustrated).

The first current source unit 411b includes, for each of the converter circuits 100, a first current source CS1 and a first switch S1 connected in series between an input voltage and the output end SW.

The second current source unit 413b includes, for each of the converter circuits 100, a second current source CS2 and a second switch S2 connected in series between the output end SW and a ground voltage. The first current source CS1 and the second current source CS2 may apply currents of different magnitudes.

The test voltage measurer measures a test voltage output from each of the output ends SW, like the test voltage measurer of the grouping detector according to the first embodiment (see 415a in FIG. 6). For each of the converter circuits 100, the test voltage is measured each time a switching operation of turning on the first switch S1 of any one of the converter circuits 100 and the second switches S2 of the other converter circuits 100 is repeated sequentially.

The grouping signal generator performs the above switching operation, compares the test voltages, and generates a grouping signal.

The operation of the grouping detector 410b will be described in more detail. FIG. 9 is based on the assumption that the four (first to fourth) converter circuits 100, the four (first to fourth) multiplexers (MUX1 to MUX4) 430, and the two (first and second) converter controllers 200 are arranged from top to bottom, the output ends SW1 and SW2 of the first and second converter circuits 100 are connected to each other, and the output ends SW3 and SW4 of the third and fourth converter circuits 100 are connected to each other, as in FIG. 6. The first current source CS1 is assumed to be much greater than the second current source CS2.

As illustrated in (i), when the grouping signal generator operates the first switch S1 and the second switch S2, the first current source CS1 between the output end SW1 and the input voltage VDD and the second current source CS2 connected between each of the output ends SW2 to SW4 and the ground voltage VSS apply test currents and the test voltage measurer measures a test voltage at each of the output ends SW1 to SW4. At this time, the grouping signal generator determines that SW2 outputting a voltage close to the same VDD as SW1 is externally connected to SW1, and SW3 and SW4 outputting VSS different from that of SW1 are not externally connected to SW1, and generates a grouping signal.

Likewise, as illustrated in (ii), test currents are applied from the first current source CS1 between the output end SW2 and the input voltage VDD and the second current source CS2 connected between each of the output ends SW1, SW3, and SW4 and the ground voltage VSS, test voltages are measured, and a grouping signal is generated. As illustrated in (iii), test currents are applied from the first current source CS1 between the output end SW3 and the input voltage VDD and the second current source CS2 connected between each of the output ends SW1, SW2, and SW4 and the ground voltage VSS, test voltages are measured, and a grouping signal is generated. As illustrated in (iv), test currents are applied from the first current source CS1 between the output end SW4 and the input voltage VDD and the second current source CS2 connected between each of the output ends SW1, SW2, and SW3 and the ground voltage VSS, test voltages are measured, and a grouping signal is generated. Once the grouping signal is generated, the multiplexer controller 450 generates output selection signals based on the grouping signal to control the multiplexers 430. When the converter circuit group and the individual converter circuit 100 are matched to the converter controllers 200, the DC/DC converter is operated normally by the converter controllers 200.

Figure 10:
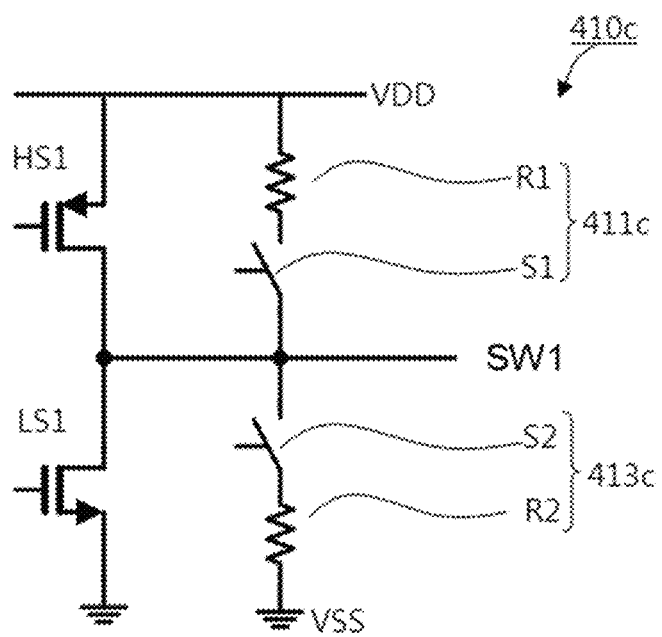
FIG. 10 schematically illustrates the configuration of a grouping detector according to a third embodiment of a DC/DC converter according to the present invention.

FIG. 10 schematically illustrates the configuration of a grouping detector according to a third embodiment of the DC/DC converter according to the present invention.

As illustrated in FIG. 10, the grouping detector 410c includes a first resistor unit 411c, a second resistor unit 413c, a test voltage measurer (not illustrated), and a grouping signal generator (not illustrated).

For each of the converter circuits 100, the first resistor unit 411c includes a first resistor R1 and a first switch S1 connected in series between an input voltage and the output end SW.

For each of the converter circuits 100, the second resistor unit 413c includes a second resistor R2 and a second switch S2 connected in series between the output end SW and a ground voltage. The first resistor R1 and the second resistor R2 have different resistance values.

The test voltage measurer measures a test voltage output from each of the output ends SW. For each of the converter circuits 100, the test voltage is measured each time a switching operation of turning on the first switch of any one of the converter circuits and the second switches of the other converter circuits is repeated sequentially.

The grouping signal generator performs the above switching operation, compares the test voltages, and generates a grouping signal.

In the grouping detector 410c according to the third embodiment, the first current source CS1 and the second current source CS2 of the grouping detector 410b according to the second embodiment are replaced by the first resistor R1 and the second resistor R2.

The operation of the grouping detector 410c will be described in more detail. FIG. 10 is based on the assumption that the four (first to fourth) converter circuits 100, the four (first to fourth) multiplexers (MUX1 to MUX4) 430, and the two (first and second) converter controllers 200 are arranged from top to bottom, the output ends SW1 and SW2 of the first and second converter circuits 100 are connected to each other, and the output ends SW3 and SW4 of the third and fourth converter circuits 100 are connected to each other, as in FIG. 6. The first resistor R1 is assumed to have a much smaller resistance than the second resistor R2.

When the grouping signal generator operates the first switch S1 and the second switch S2, the first resistor R1 is electrically connected between the output end SW1 and the input voltage VDD and the second resistor R2 is electrically connected between each of the output ends SW2 to SW4 and the ground voltage VSS and the test voltage measurer measures a test voltage at each of the output ends SW1 to SW4. At this time, the grouping signal generator determines that SW2 outputting a voltage close to the same VDD as SW1 is externally connected to SW1, and SW3 and SW4 outputting VSS different from that of SW1 are not externally connected to SW1, and generates a grouping signal.

Likewise, the first resistor R1 is electrically connected between SW2 and VDD, the second resistor R2 is electrically connected between each of SW1, SW3, and SW4 and VSS, test voltages are measured, and a grouping signal is generated. Further, the first resistor R1 is electrically connected between SW3 and VDD, the second resistor R2 is electrically connected between each of SW1, SW2, and SW4 and VSS, test voltages are measured, and a grouping signal is generated. Further, the first resistor R1 is electrically connected between SW4 and VDD, the second resistor R2 is electrically connected between each of SW1, SW2, and SW3 and VSS, test voltages are measured, and a grouping signal is generated. Once the grouping signal is generated, the multiplexer controller 450 generates output selection signals based on the grouping signal to control the multiplexers 430. When the converter circuit group and the individual converter circuit 100 are matched to the converter controllers 200, the DC/DC converter is normally operated by the converter controllers 200.

Although the present invention has been described herein with reference to the specific embodiments, these embodiments do not serve to limit the invention and are set forth for illustrative purposes. It will be apparent to those skilled in the art that modifications and improvements can be made without departing from the spirit and scope of the invention. Such simple modifications and improvements of the present invention belong to the scope of the present invention, and the specific scope of the present invention will be clearly defined by the appended claims.

Explanation of Reference Numerals

| | |
|---|---|
| HS: High-side switch | LS: Low-side switch |
| SW: Output end | 100: Converter circuit |
| 200: Converter controller | 300: Grouping unit |
| 400: Grouping controller | 410, 410a, 410b, 410c: Grouping detectors |
| 411a: Current source | 413a: Switch |
| 415a: Test voltage measurer | 417a: Grouping signal generator |
| 411b: First current source unit | CS1: First current source |
| S1: First switch | 413b: Second current source unit |
| CS2: Second current source | S2: Second switch |
| 411c: First resistor unit | R1: First resistor |
| 413c: Second resistor unit | R2: Second resistor |
| 430: Multiplexer | 450: Multiplexer controller |

What is claimed is:

1. A direct current/direct current (DC/DC) converter, comprising:

N (N is a natural number equal to or greater than 2) converter circuits, each comprising a high-side switch connected to an input voltage, a low-side switch connected to the high-side switch at one node, and an output end connected to the node to output an output voltage; and M (M is a natural number equal to or greater than 2) converter controllers configured to control the N converter circuits, wherein the N converter circuits form K (K is a natural number equal to or greater than 1) converter circuit groups, each having one integrated output end obtained by electrically connecting the output ends of at least two of the N converter circuits to each other, and wherein the K converter circuit groups are integrally controlled by the converter controllers on a one-to-one basis, wherein the DC/DC converter further comprises a grouping controller configured to monitor whether the converter circuit groups have been formed and to match individual converter circuits not constituting converter circuit groups and the converter circuit groups to the corresponding M converter controllers, and wherein the grouping controller comprises a grouping detector configured to detect whether the converter circuit groups have been formed and to generate a grouping signal comprising information about the individual converter circuits and the converter circuit groups, N multiplexers corresponding one-to-one to the N converter circuits, each being configured to select any one of switching control signals input from the M converter controllers, for the high-side switch and the low-side switch of a converter circuit corresponding to the multiplexer, and output the selected switching control signal to the converter circuit, and a multiplexer controller configured to transmit an output selection signal to each of the N multiplexers to select the output switching control signal, based on the grouping signal.

2. The DC/DC converter according to claim 1, further comprising a grouping unit configured to connect the at least two output ends to each other to form the converter circuit group.

3. The DC/DC converter according to claim 1, wherein the grouping detector comprises a current source configured to apply a test current to each of the output ends of the converter circuits, a switch arranged between the current source and each of the output ends, a test voltage measurer configured to measure a test voltage at each of the output ends, whenever each of the switches is turned on and a switching operation of turning on any one of the low-side switches and turning off the other low-side switches is repeated sequentially, and a grouping signal generator configured to perform the switching operation, compare the test voltages, and generate the grouping signal.

4. The DC/DC converter according to claim 1, wherein the grouping detector comprises a first current source unit comprising, for each of the converter circuits, a first current source and a first switch connected in series between the input voltage and the output end, a second current source unit comprising, for each of the converter circuits, a second current source and a second switch connected in series between the output end and a ground voltage, a test voltage measurer configured to, for each of the converter circuits, measure a test voltage at the output end whenever a switching operation of turning on the first switch of any one of the converter circuits and the second switches of the other converter circuits is repeated sequentially, and a grouping signal generator configured to perform the switching operation, compare the test voltages, and generate the grouping signal.

5. The DC/DC converter according to claim 1, wherein the grouping detector comprises a first resistor unit comprising, for each of the converter circuits, a first resistor and a first switch connected in series between the input voltage and the output end, a second resistor unit comprising, for each of the converter circuits, a second resistor and a second switch connected in series between the output end and a ground voltage, a test voltage measurer configured to, for each of the converter circuits, measure a test voltage at the output end whenever a switching operation of turning on the first switch of any one of the converter circuits and the second switches of the other converter circuits is repeated sequentially; and a grouping signal generator configured to perform the switching operation, compare the test voltages, and generate the grouping signal.

* * * * *